(12) United States Patent
Takasu et al.

(10) Patent No.: US 7,871,714 B2
(45) Date of Patent: Jan. 18, 2011

(54) POLYMER, ELECTROLUMINESCENT DEVICE, AND LIGHT EMITTING DEVICE

(75) Inventors: Takako Takasu, Kanagawa (JP); Satoshi Seo, Kanagawa (JP); Ryoji Nomura, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 52 days.

(21) Appl. No.: 12/339,112

(22) Filed: Dec. 19, 2008

(65) Prior Publication Data

US 2009/0102374 A1 Apr. 23, 2009

Related U.S. Application Data

(62) Division of application No. 10/743,337, filed on Dec. 23, 2003, now abandoned.

(30) Foreign Application Priority Data

Dec. 25, 2002 (JP) ............................. 2002-375654

(51) Int. Cl.
*H01L 51/54* (2006.01)
*C09K 11/06* (2006.01)
*C08G 75/00* (2006.01)

(52) U.S. Cl. ................... 428/690; 428/917; 313/504; 313/506; 257/88; 257/89; 257/E51.022; 257/E51.029; 257/E51.036; 528/380; 528/396

(58) Field of Classification Search ................ None
See application file for complete search history.

(56) References Cited

U.S. PATENT DOCUMENTS

| | | | |
|---|---|---|---|
| 5,068,060 A | 11/1991 | Jen et al. | |
| 5,098,529 A | 3/1992 | Feldhues | |
| 5,126,214 A | 6/1992 | Tokailin et al. | |
| 5,139,703 A | 8/1992 | Jen et al. | |
| 5,159,040 A | 10/1992 | Jen et al. | |
| 5,162,473 A | 11/1992 | Jen et al. | |
| 5,225,109 A | 7/1993 | Feldhues et al. | |
| 5,281,489 A | 1/1994 | Mori et al. | |
| 5,734,065 A | 3/1998 | Saika | |
| 6,194,119 B1 | 2/2001 | Wolk et al. | |
| 6,291,621 B1 | 9/2001 | Tan et al. | |
| 6,294,245 B1 | 9/2001 | Roitman et al. | |
| 6,602,395 B1 | 8/2003 | Zhuang et al. | |
| 6,998,181 B2 | 2/2006 | O'Dell et al. | |
| 2001/0001050 A1 | 5/2001 | Miyashita et al. | |
| 2002/0011420 A1 | 1/2002 | Roitman et al. | |
| 2002/0041926 A1 | 4/2002 | Miyashita et al. | |
| 2002/0136823 A1 | 9/2002 | Miyashita et al. | |
| 2002/0155215 A1 | 10/2002 | Miyashita et al. | |
| 2003/0054186 A1 | 3/2003 | Miyashita et al. | |
| 2003/0059646 A1 | 3/2003 | Kamatani et al. | |
| 2003/0137325 A1 | 7/2003 | Yamazaki et al. | |
| 2003/0160234 A1* | 8/2003 | Ong et al. | 257/40 |
| 2003/0166829 A1* | 9/2003 | Ong et al. | 528/394 |
| 2004/0119049 A1 | 6/2004 | Heeney et al. | |

FOREIGN PATENT DOCUMENTS

| | | |
|---|---|---|
| EP | 0 384 829 A1 | 8/1990 |
| EP | 0 698 605 A1 | 2/1996 |
| EP | 0-698905 | 2/1996 |
| EP | 1 049 167 A2 | 11/2000 |
| EP | 1 439 590 A2 | 7/2004 |
| EP | 1 852 922 A2 | 11/2007 |
| JP | 57-157487 | 9/1982 |
| JP | 58-147989 | 9/1983 |
| JP | 60-229917 | 11/1985 |
| JP | 62-207324 | 9/1987 |
| JP | 63-161024 | 7/1988 |
| JP | 01-261470 | 10/1989 |
| JP | 01-315988 | 12/1989 |
| JP | 02-218716 | 8/1990 |
| JP | 02-273496 | 11/1990 |
| JP | 03-152897 | 6/1991 |
| JP | 03-179023 | 8/1991 |
| JP | 03-0179023 | 8/1991 |
| JP | 03-214593 | 9/1991 |
| JP | 05-255484 | 10/1993 |
| JP | 09-097679 | 4/1997 |
| JP | 10-153967 | 6/1998 |

(Continued)

OTHER PUBLICATIONS

Pei et al., "A Novel Series of Efficient Thiophene-Based Light-Emitting Conjugated Polymers . . .", Macromolecules, vol. 33, pp. 2462-2471, (2000).

(Continued)

*Primary Examiner*—Marie R. Yamnitzky
(74) *Attorney, Agent, or Firm*—Nixon Peabody LLP; Jeffrey L. Costellia

(57) ABSTRACT

A novel electroluminescent polymer is represented by the following formula. A film of the polymer represented by the following formula can be formed by electrolytic polymerization, and farther emits light in a different color by an electric field when a substituent thereof is changed. Therefore, a light-emitting device that is capable of multicolor displaying can be easily obtained.

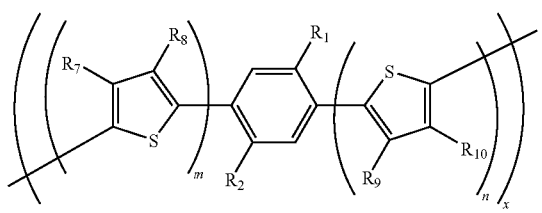

14 Claims, 3 Drawing Sheets

FOREIGN PATENT DOCUMENTS

| | | |
|---|---|---|
| JP | 11-087062 | 3/1999 |
| JP | 11-106484 | 4/1999 |
| JP | 11-209461 | 8/1999 |
| JP | 2001-094130 | 4/2001 |
| JP | 2001-335639 | 12/2001 |
| JP | 2004-186695 | 7/2004 |
| WO | WO-88-00954 | 2/1988 |
| WO | WO 01/78151 A2 | 10/2001 |
| WO | WO 01/78151 A3 | 10/2001 |
| WO | WO 02/26859 A1 | 4/2002 |

OTHER PUBLICATIONS

European Search Report (Application No. 03780763.3-2102; PCT/JP03/16029) Dated Jun. 6, 2006.

F. Larmat et al., "Comparative Reactivity of Thiophene and 3,4-(Ethylenedioxy) thiophene as Terminal Electropolymerizable Units in Bis-Heterocycle arylenes", *Journal of Polymer Science: Part A: Polymer Chemistry*, vol. 35, No. 17, Dec. 1997, pp. 3627-3636.

E. Becker et al., "High-Resolution Patterning of Organic Thin Films for Device Applications", *MST News*, No. 1/02, Feb. 2002, pp. 41-42.

S. Inaoka et al., "Patterning and Electrochemical Deposition of Conjugated and Conducting Polymers in Organic Light-Emitting Diodes", *Polymer Preprints, American Chemical Society*, vol. 41, No. 1, Mar. 26, 2000, pp. 808-809.

Official Communication Pursuant to Article 96(2) EPC—Application No. 03780763.3-2102 (PCTEP6829), Oct. 12, 2006.

Grant & Hackh's Chemical Dictionary 5th ed., 1987, McGraw-Hill, Inc. pp. 53.

International Search Report (PCT/JP03/16029 dated Mar. 30, 2004.

International Preliminary Examination Report, (PCT/JP03/16029), with partial translation, dated Jul. 27, 2004.

Tada et al., "Optical properties . . . poly(1,4-bis(2-thienyl)-2-5-dialkoxy phenylene)", J. Phys. D: Appl. Phys., vol. 30, pp. 2063-2068 (1997).

Sarker et al., "Photoluminescence of substituted phenylene-thienyl based polymers", Synthetic Metals, vol. 113, pp. 151-154, (2000).

Jian Pei et al., "Thiophene-Based Conjugated Polymers for Light-Emitting Diodes: Effect of Aryl Groups on Photoluminescence Efficiency and Redox Behavior," *Macromolecules*, 2001, pp. 7241-7248, vol. 34, No. 21.

Cheng Yang et al., "Regioregular Di(2'-(thienyl))furan-and Di(2'-(thienyl))benzene-Based Polymers: Steric and Heavy-Atom Effects on the Luminescence of Conjugated Systems," *Macromolecules*, 1999, pp. 6889-6891, vol. 32, No. 20.

Kenneth J. Hoffmann et al., "Broken π-Conjugated Thiophene Systems: 3. Synthesis and Polymerization of 2,2-di(alkylthien-2-yl) Propanes," *Synthetic Metals*, 2000, pp. 161-165, vol. 114, No. 2.

Yoshihiko Kanemitsu et al., "Luminescence from Oligothiophenes and Thiophene-Based Oligomers," *Synthetic Metals*, 1995, pp. 2209-2210, vol. 71, No. 1-3.

* cited by examiner

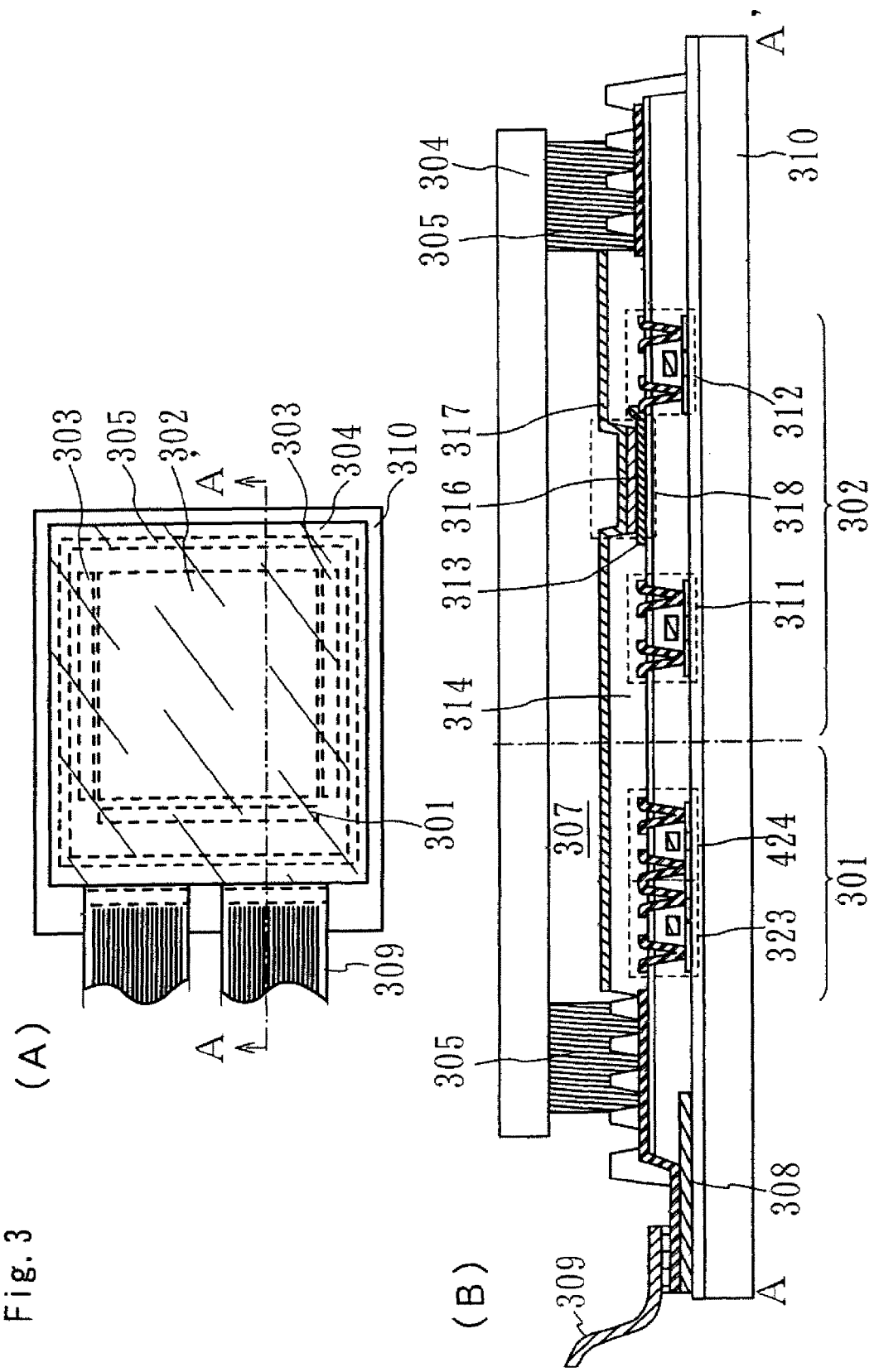

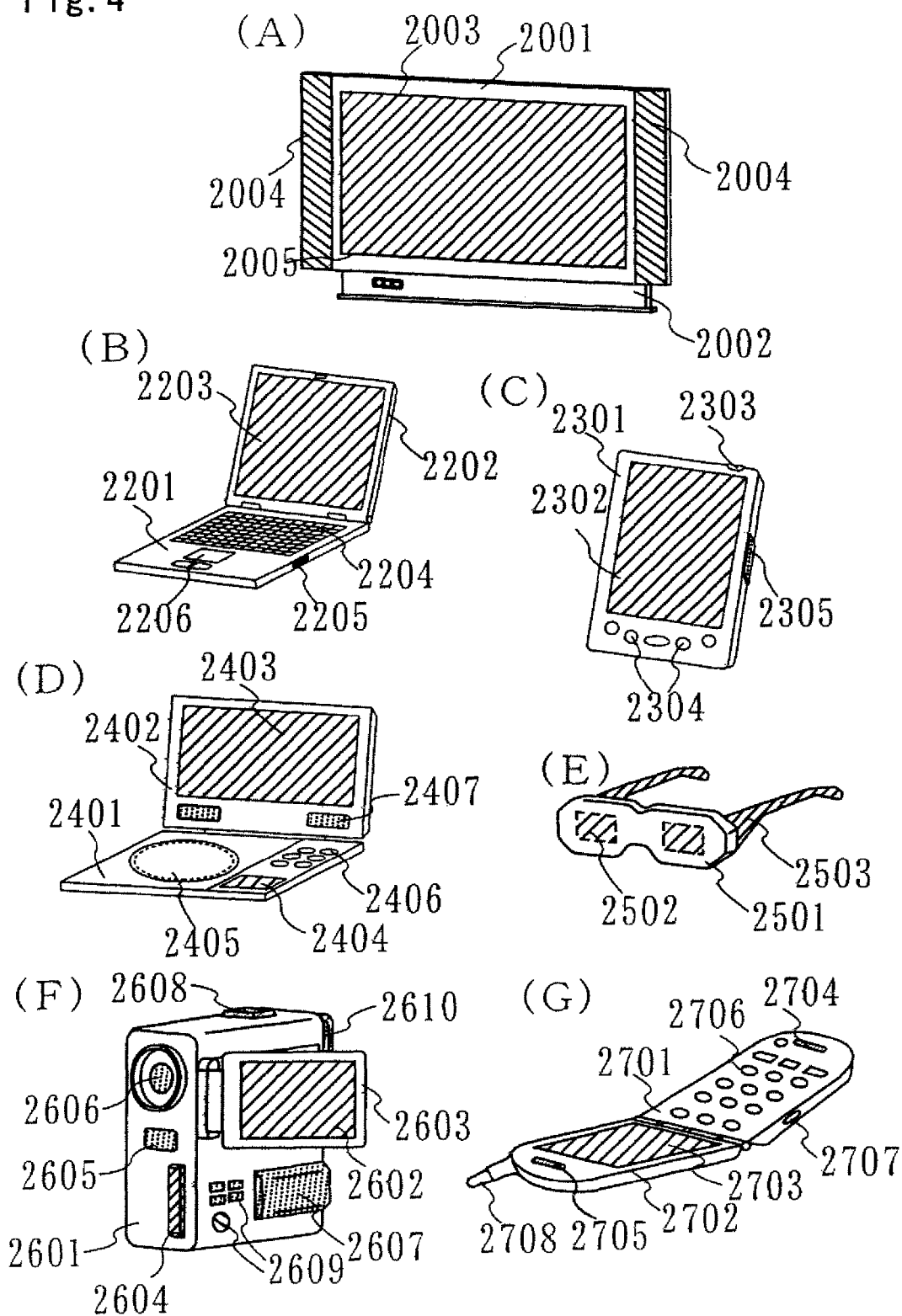

POLYMER, ELECTROLUMINESCENT DEVICE, AND LIGHT EMITTING DEVICE

TECHNICAL FIELD

The present invention relates to an electroluminescent polymer, in particular, relates to a polymer that can be formed by electrolytic polymerization. In addition, the present invention an electroluminescent device, a light-emitting device, and the like using this polymer.

BACKGROUND ART

Since an electroluminescent element utilizing electroluminescence of an organic compound has high visibility due to being self-luminous, and has characteristics such as a low driving voltage, the use as a light-emitting device has attracted attention in various display devices.

Further, particularly in order to expand applications of the aforementioned electroluminescent device, a multicolor application such as an area-color or full-color display (hereinafter, referred to as "a multicolor display device") is expected.

As methods of manufacturing a multicolor display device using an electroluminescent device, the following methods are known:

(1) A method of arranging EL materials emit in three primary colors of red (R), green (G), blue (B) in a matrix (Refer to Japanese Patent Laid-Open No. 57-157487, Japanese Patent Laid-Open No. 58-147989, and Japanese Patent Laid-Open No. 3-214593, for example.).

(2) A method of taking out three primary colors of RGB, where an EL device that emits in white is combined with a color filter (Refer to Japanese Patent Laid-Open No. 1-315988 and Japanese Patent Laid-Open No. 2-273496, for example.).

(3) A method of converting into three primary colors of RGB, where an EL device that emits in blue is combined with a color-changing fluorescent film (Refer to Japanese Patent Laid-Open No. 3-152897, for example).

(4) Further, a technique of making a conductive polymer material that is used for an electroluminescent device into ink to perform patterning of an EL material by an ink-jet method is known as a method of manufacturing a multicolor display device without forming a color filter or a fluorescence conversion filter required for the aforementioned method (2) or (3) (Japanese Patent Laid-Open No. 10-153967 and Japanese Patent Laid-Open No. 11-87062, for example).

However, a group of π-conjugated polymers that have been researched long as conductive polymer materials in terms of advantages such as stability have rigid main chains, and are often insoluble or non-melted generally, which therefore cannot be used in the aforementioned ink-jet method. Consequently, for the use in the ink-jet method, a chemical contrivance (such as introduction of a substituent) for solubilizing the conductive polymer materials is required. However, in the case of being solubilized, there is a problem such as lowering of a charge transport property or thermal stability. Further, In the case of forming the conductive polymer materials by the ink-jet method as a hole injection layer, advanced techniques are required in order to prevent an electric leak between respective pixels (crosstalk).

Besides, as another method of manufacturing an electroluminescent device, electrochemical methods have been proposed. As one of the electrochemical methods, electrolytic polymerization is known, which is a method in which at least one of an anode electrode and a cathode electrode opposed mutually is dipped in an electrolytic solution (a polymerization solution) including a material for forming a hole transport layer or an electron transport layer, and then, the hole transport layer or the electron transport layer is formed on the dipped anode electrode or cathode electrode to be covered by applying a voltage between the anode electrode and the cathode electrode. In manufacturing of an electroluminescent device by electrolytic polymerization, a conjugated polymer material that is superior in an injection of a hole or an electron and a charge transport performance and also has high stability thermally can be used (Refer to Japanese Patent Laid-Open 9-976979, for example.). However, an organic material for forming a light-emitting layer by an electrochemical method is not mentioned at all in Japanese Patent Laid-Open 9-976979.

DISCLOSURE OF INVENTION

Problem to be Solved by the Invention

Among methods of manufacturing a multicolor display device, a method that is required to form a color filter or a fluorescence conversion filter has a defect that an increase in cost is unavoidable as a color filter for a conventional liquid crystal display device Further, although the case of using an ink-jet method does not have these defects, advanced techniques are required, and the problem is that a polymer material to be used has to be soluble.

In addition, while it is known that a conjugated polymer material that is superior in a charge injection and transport property and also has high stability thermally can be used as an electron transport layer when an electrochemical method such as electrolytic polymerization is used to form a hole transport layer or the electron transport layer, forming a light-emitting layer by electrolytic polymerization is not known. In other words, an organic material for forming a light-emitting layer, which can be synthesized by electrolytic polymerization, is not known.

It is an object of the present invention to resolve the defect of related art to propose a group of polymers that can be polymerized by electrolytic polymerization and emits various colors by an electric field. In addition, it is an object of the present invention to provide an electroluminescent device using this group of polymers and a light-emitting device such as a multicolor display device.

Means for Solving the Problem

In order to solve the above-mentioned objects, a structure of a polymer according to the present invention is characterized by the following general formula (I) as a repeating unit.

(Formula I)

(1)

[In the general formula (I), m and n are 1 or 2, A is any of the following (a-1) to (a-20), and B and B' are identical or different, and are either (b-1) or (b-2).

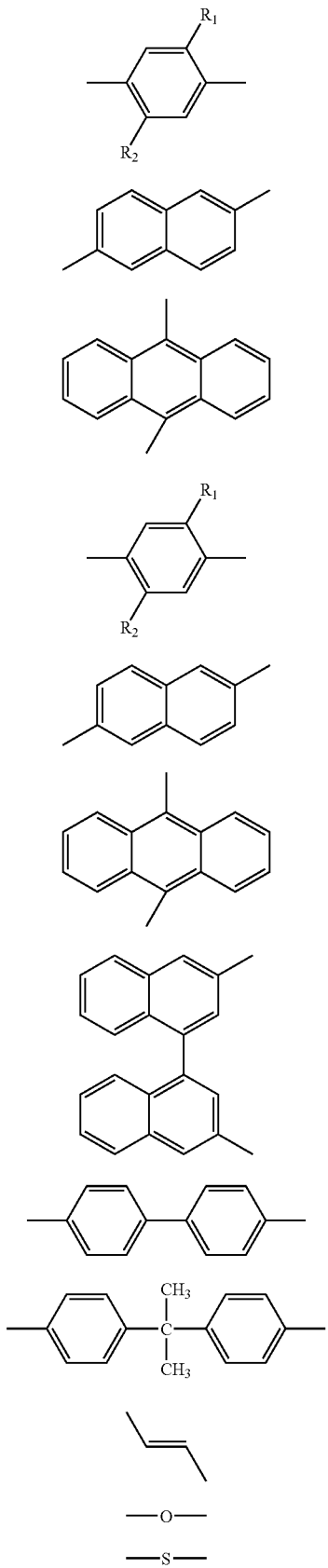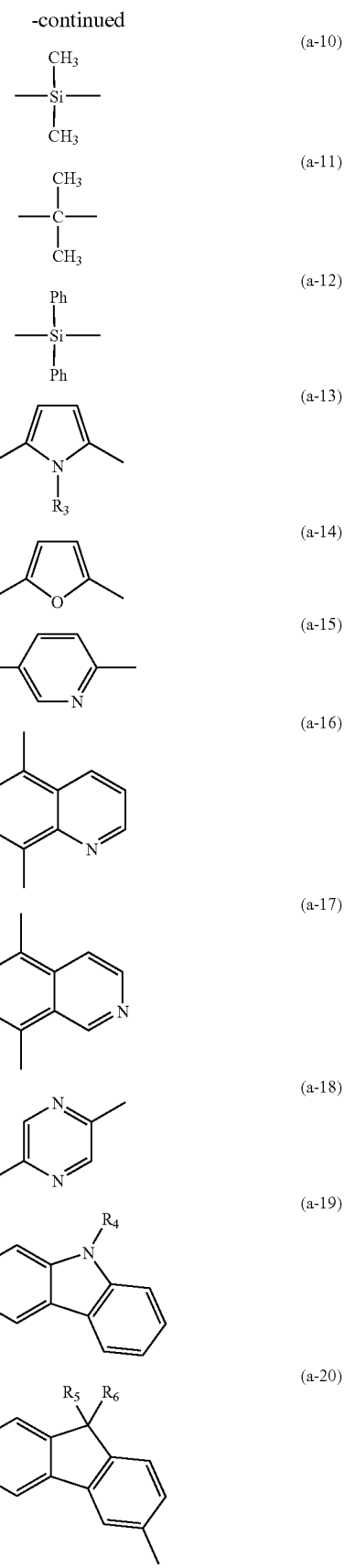

($R_1$ and $R_2$ of (a-1) and $R_5$ and $R_6$ of (a-20) are identical or different, and $R_1$ to $R_6$ are a hydrogen atom, a hologen atom, or an organic substituent that may include an oxygen atom, a sulfur atom or a nitrogen atom.)

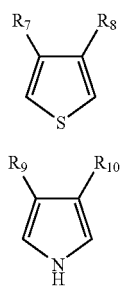

(b-1)

(b-2)

($R_7$ and $R_8$ of (b-1) and $R_9$ and $R_{10}$ of (b-2) are respectively identical or different, and $R_7$ to $R_{10}$ are a hydrogen atom, a hologen atom, or an organic substituent that may include an oxygen atom, a sulfur atom or a nitrogen atom.)]

The polymer shown by the aforementioned general formula (I) is a compound designed with a focus mainly on a synthesis by electrolytic polymerization being possible, and is a novel polymer found by the inventors. Of course, a polymer according to the present invention can not only be synthesized by electrolytic polymerization but also by formed by a known synthesis method.

In addition, the novel polymer represented by the aforementioned general formula (I) is made to emit light by an electric field, and therefore can be used as a light-emitting layer (a light emitter) of an electroluminescent device. Consequently, as another invention, the present invention is related to an electroluminescent device, which is characterized by having a layer including a polymer that has a repeating unit represented by the aforementioned general formula (I) between a pair of electrodes.

In the electroluminescent device that has the aforementioned structure, the layer including the polymer functions as a light-emitting layer. Further, in order to take out light emitted by the layer including the polymer, one or both of the pair of electrode may be transparent or translucent.

The aforementioned electroluminescent device is characterized also in that the layer including the polymer is formed by electrolytic polymerization.

In addition, a light-emitting device can be formed by having a plurality of electroluminescent devices as the above as pixels.

In other words, a first light-emitting device according to the present invention is a light-emitting device that has a plurality of electroluminescent device, each of the plurality of electroluminescent device has an opposed pair of electrodes and a layer including a polymer formed between the pair of the electrodes, and is characterized in that the polymer is a compound that has a repeating unit represented by the aforementioned general formula (I).

In addition, a layer including a polymer represented by the aforementioned general formula (I) is appropriate as a light-emitting layer a so-called passive electroluminescent display.

In other words, a second light-emitting device according to the present invention has a substrate that has an insulating surface, a plurality of stripe-shaped first electrodes formed at the insulating surface of the substrate, a layer including a polymer, which is formed on each of the plurality of first electrodes, and a plurality of stripe-shaped second electrodes arranged to be orthogonal to the first electrodes, which are formed on the plurality of layers including the polymer, and is characterized in that the polymer is a compound that has a repeating unit represented by the aforementioned general formula (I).

Further, a third light-emitting device according to the present invention has a substrate that has an insulating surface, a plurality of first electrodes formed at the insulating surface of the substrate, a layer including a polymer, which is formed on each of the plurality of first electrodes, and a second electrode opposed to each of the plurality of first electrodes with the plurality of layers including the polymer interposed in between, and is characterized in that the polymer is a compound that has a repeating unit represented by the aforementioned general formula (I).

In the aforementioned first to three display devices according to the present invention, one of the plurality of layers including the polymer is characterized in that the included polymer is different from those of the other layers including the polymer. This structure makes it possible to emit light in plural colors and obtain a light-emitting display device that is capable of multicolor displaying.

In a similar way, a fourth light-emitting device according to the present invention is a device that becomes capable of multicolor displaying, has a plurality of first to third pixels that emit light in different colors from each other on a substrate that has an insulating surface, has a plurality of first electrodes, a layer including a polymer, which is formed on each of the plurality of first electrodes, and a second electrode opposed to the plurality of first electrodes, which is formed on the layer including the polymer, and is characterized in that the first electrode is provided with respect to each of the plurality of first to third pixels, the second electrode is provided in common with the plurality of first to third pixels, the polymer is a compound that has a repeating unit represented by the aforementioned general formula (I), and the polymer of the layer including the polymer is different from each other in the first to third pixels.

Further, an electroluminescent device according to the present invention, which uses a novel polymer represented by the aforementioned general formula (I), can be applied to an active matrix light-emitting device. In this case, in the aforementioned third and fourth light-emitting devices according to the present invention, it is preferable to further include a data signal line, a scan signal line, a nonlinear element connected to the data signal line, the scan signal line, and the first electrode. It is preferable that the nonlinear element is composed of a combination of a thin film transistor and a capacitor connected to each other or a combination of a thin film transistor and a parasitic capacitor of the thin film transistor.

The layer including a polymer in the specification indicates a layer that may include a component taken unavoidably for forming the layer, various additives, or another component not to directly relevant to a function of the layer or not to prevent a function of the layer.

The light-emitting device in the specification indicates a light-emitting device and an image display device, and the like that use an organic light-emitting element. In addition, a module that has a connecter such as an anisotropic conductive film (ACF: Anisotropic Conductive Film), a flexible printed circuit (FPC: Flexible printed circuit) a TAB (Tape Automated Bonding) tape, or a TCP (Tape Carrier Package) attached, a module that has a printed wiring board provided at the tip of a TAB tape or a TCP, and a module that has an IC (integrated circuit) directly mounted by a COG (Chip On Glass) method are all included in the light-emitting device.

Effect of the Invention

The group of polymers represented by the general formula (I) according to the present invention can be synthesized by electrolytic polymerization. Since polymerization and formation of a patterned film can be carried out at the same time in the electrolytic polymerization, an electroluminescent device can be easily made.

Consequently, it is possible to provide a light-emitting device that is capable of multicolor displaying, which uses a layer including a novel polymer according to the present invention for a light-emitting layer.

BRIEF DESCRIPTION OF DRAWINGS

FIGS. 3A and 3B are top views and sectional views of a light-emitting device.

FIGS. 4A, 4B, 4C, 4D, 4E, 4F and 4G are specific examples of electric appliances.

BEST MODE FOR CARRYING OUT THE INVENTION

Figure 1:
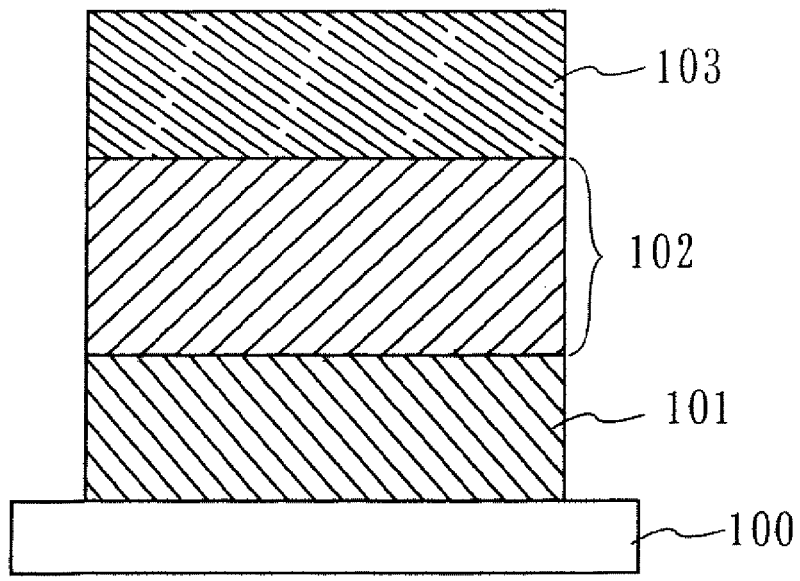
FIG. 1 is a diagram showing sectional structure of an electroluminescent device.

First, specific examples of polymers represented by the aforementioned general formula (I) will be described.

First, specific examples of the $R_1$ to $R_6$ of the A in the general formula (I) will be described. The $R_1$ to $R_6$ includes an aliphatic hydrocarbon group having 4 to 30 carbon atoms (such as an n-butyl group, an isobutyl group, a sec-butyl group, a tert-butyl group, an n-pentyl group, an n-peptyl group, a 2,6-dimethylheptyl group, 1-ethylpentyl group, an n-octyl group, an n-decyl group, an undecyl group, or an n-heptadecyl group) and a cyclohydrocarbon group having 4 to 10 carbon atoms (such as a cyclobutyl group, a cyclopentyl group, a cyclohexyl group, a cycloheptyl group, a cyclooctyl group, a cyclononyl group, or a cyclodecyl group). Alternatively, an aromatic group such as a phenyl group, a naphthyl group, an anthranil group, or a pyrenyl group may be included.

These aromatic groups may be connected to a carbonyl group with an alkylene group having 1 to 5 carbon atoms in between. In addition, a group having a heterocycle may be included. Further, the aforementioned substituents may be connected to a thiophene moiety or pyrrol with an oxygen atom, a sulfur atom, a nitrogen atom, or a silicon atom.

In addition, specific examples of the substituents $R_7$ to $R_{10}$ in B and B' of the general formula (I) include an aliphatic hydrocarbon group having 4 to 30 carbon atoms (such as an n-butyl group, an isobutyl group, a sec-butyl group, a tert-butyl group, an n-pentyl group, an n-peptyl group, a 2,6-dimethylheptyl group, 1-ethylpentyl group, an n-octyl group, an n-decyl group, an undecyl group, or an n-heptadecyl group) and a cyclohydrocarbon group having 4 to 10 carbon atoms (such as a cyclobutyl group, a cyclopentyl group, a cyclohexyl group, a cycloheptyl group, a cyclooctyl group, a cyclononyl group, or a cyclodecyl group). Alternatively, an aromatic group such as a phenyl group, a naphthyl group, an anthranil group, or a pyrenyl group may be included.

These aromatic groups may be connected to a carbonyl group with an alkylene group having 1 to 5 carbon atoms in between. In addition, a group having a heterocycle may be included. Further, the aforementioned substituents may be connected to a thiophene moiety or pyrrol with an oxygen atom, a sulfur atom, a nitrogen atom, or a silicon atom.

Next, a material for forming the polymer represented by the general formula (I) will be described.

This polymer represented by the general formula (I) can be obtained by cationic polymerization of a monomer represented by the following general formula (II). A, B, and B' in the general formula (II) are the same as A, B, and B' in the general formula (I), respectively.

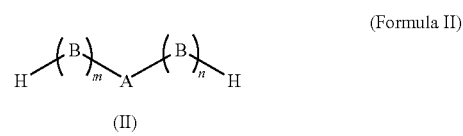

(Formula II)

(II)

Next, preferable examples of monomers represented by the aforementioned general formula (II) are shown below, of course, which is not limited to these monomers in order to form a polymer according to the present invention.

The following monomers shown by chemical formulas (1) to (20) are specific examples in the case where B and B' are both the thiophene represented by (b-1).

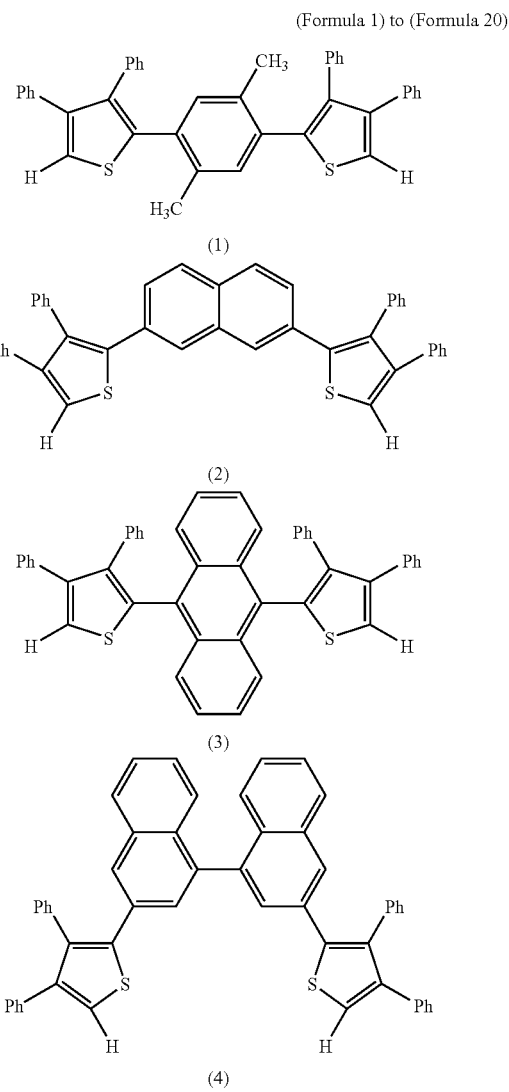

(Formula 1) to (Formula 20)

(1)

(2)

(3)

(4)

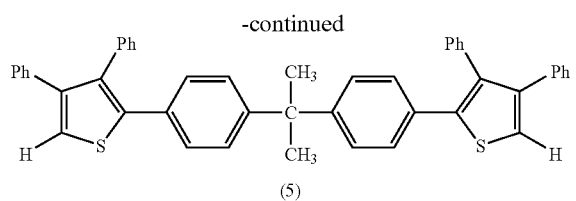
(5)
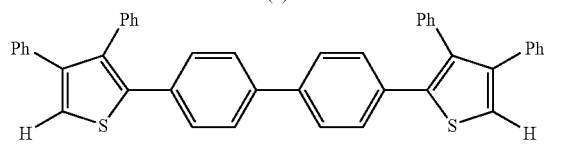
(6)
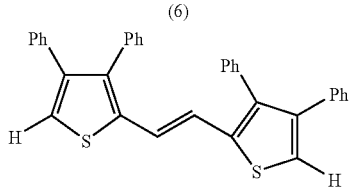
(7)
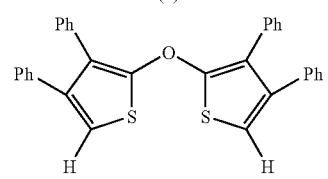
(8)
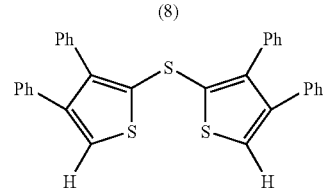
(9)
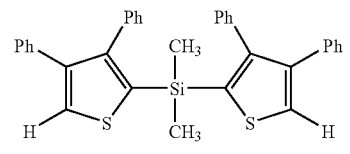
(10)
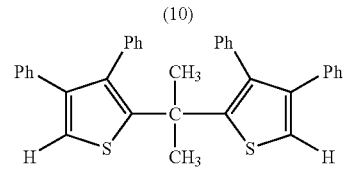
(11)
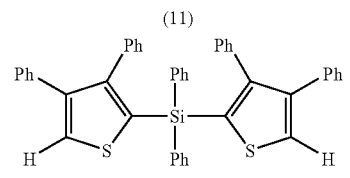
(12)
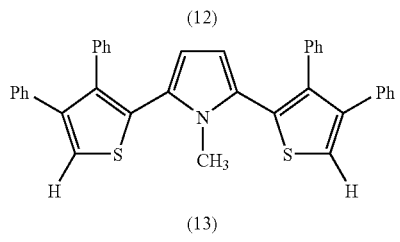
(13)
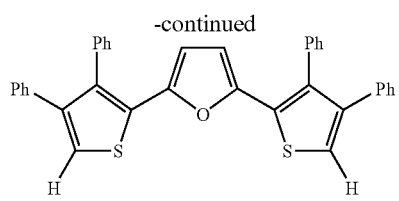
(14)
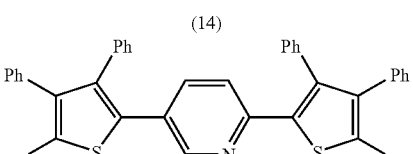
(15)
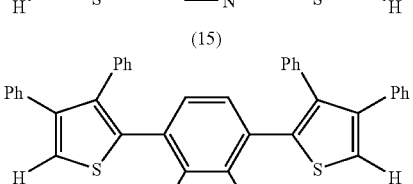
(16)
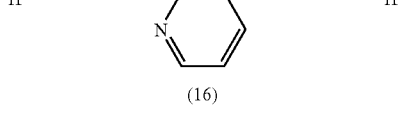
(17)
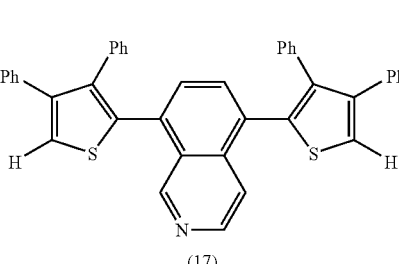
(18)
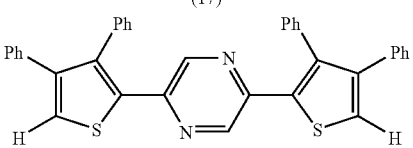
(19)
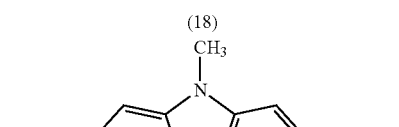
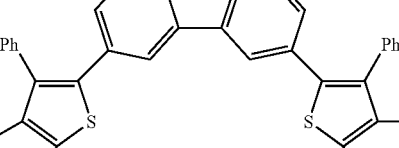
(20)

The following monomers shown by chemical formulas (21) to (40) are specific examples in the case where B and B' are both the pyrrol represented by (b-2).
(Formula 21) to (Formula 40)
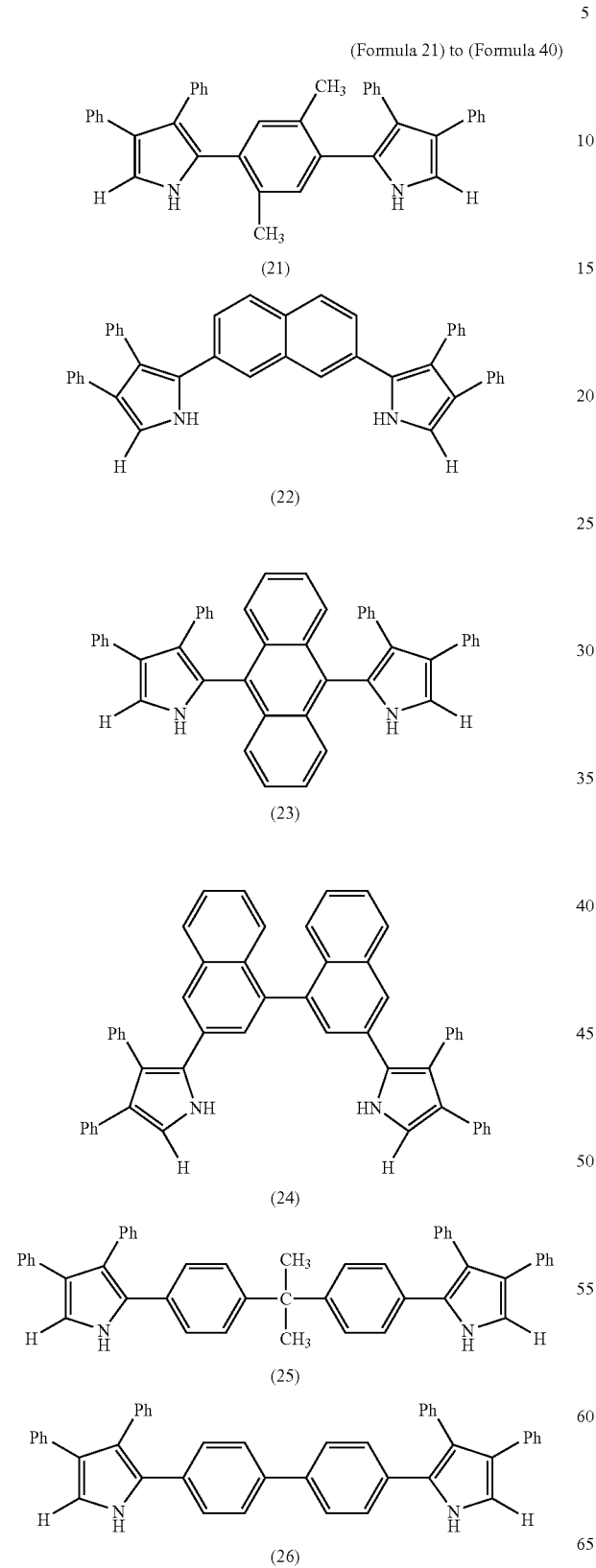
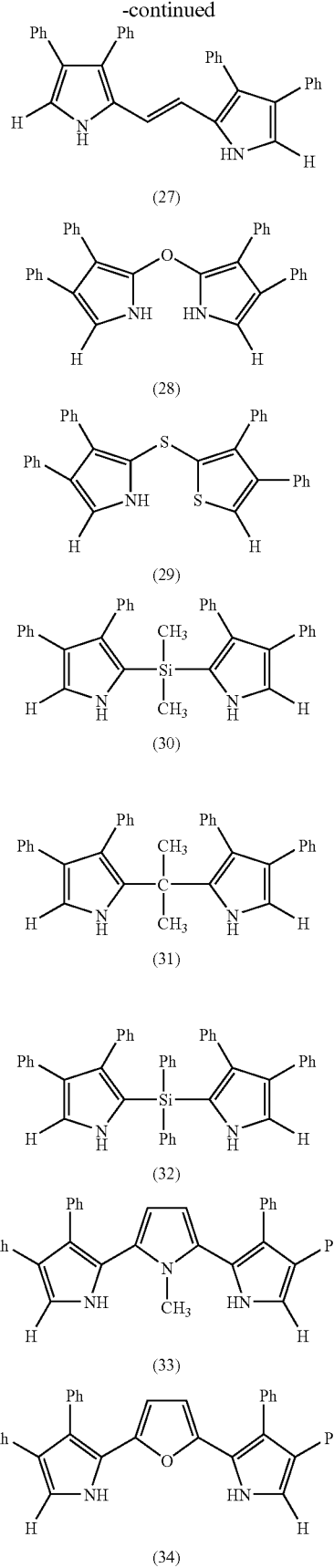

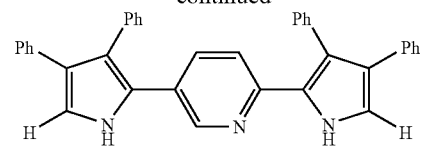
(35)
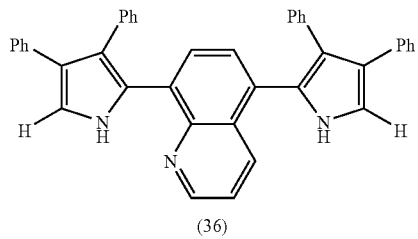
(36)
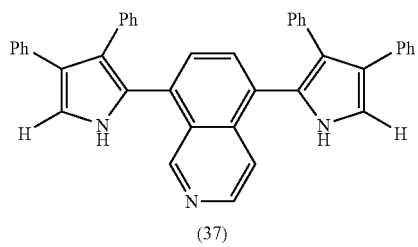
(37)
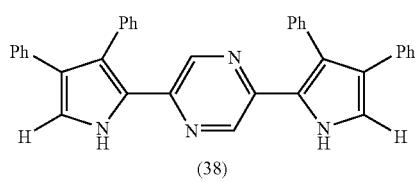
(38)
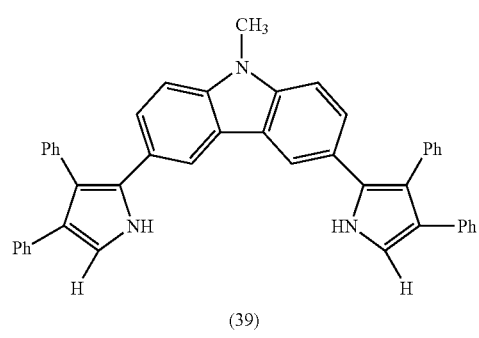
(39)
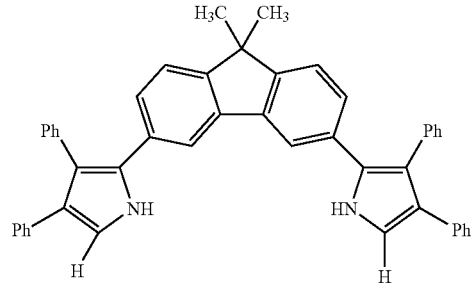
(40)
The following monomers shown by chemical formulas (41) to (60) are specific examples in the case where one of B and B' is (b-1) and the other is (b-2).
(Formula 41) to (Formula 60)
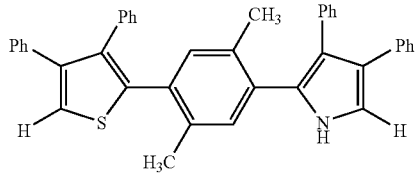
(41)
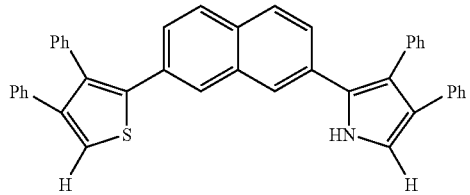
(42)
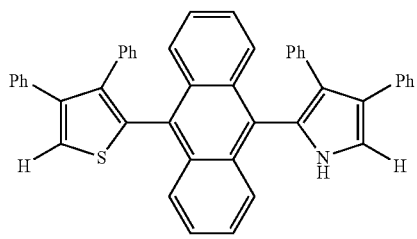
(43)
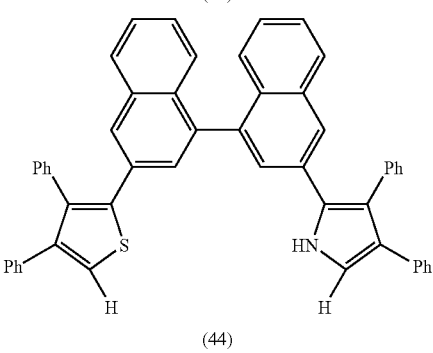
(44)
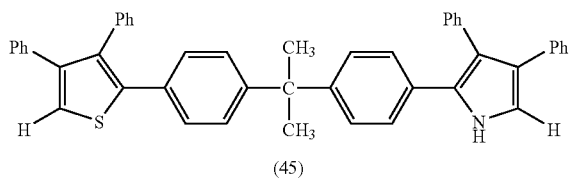
(45)
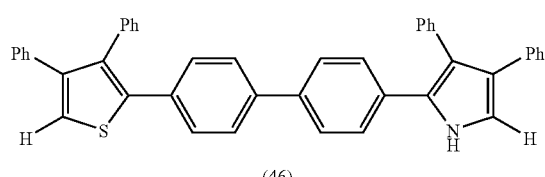
(46)
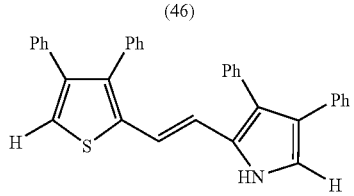
(47)

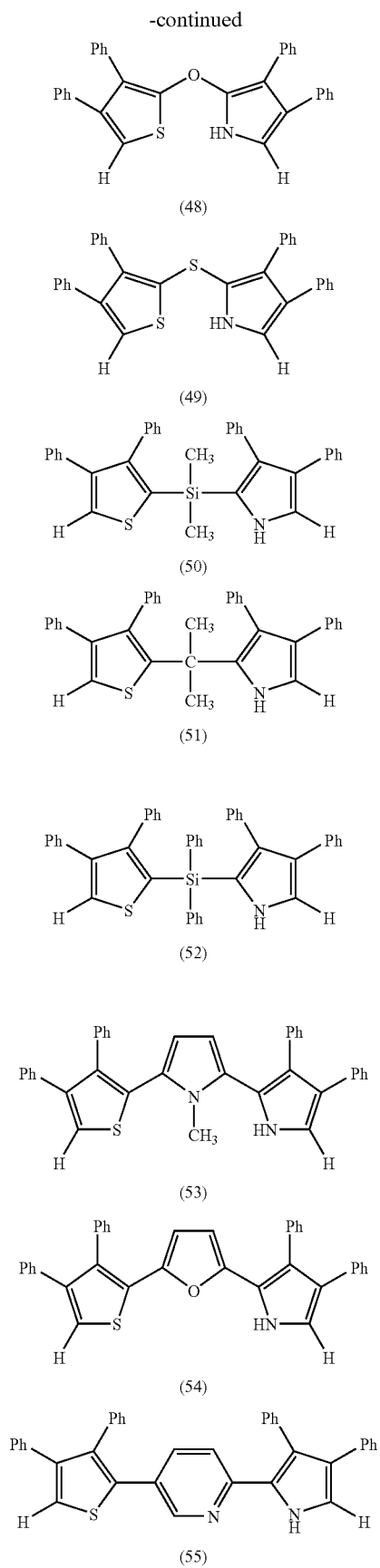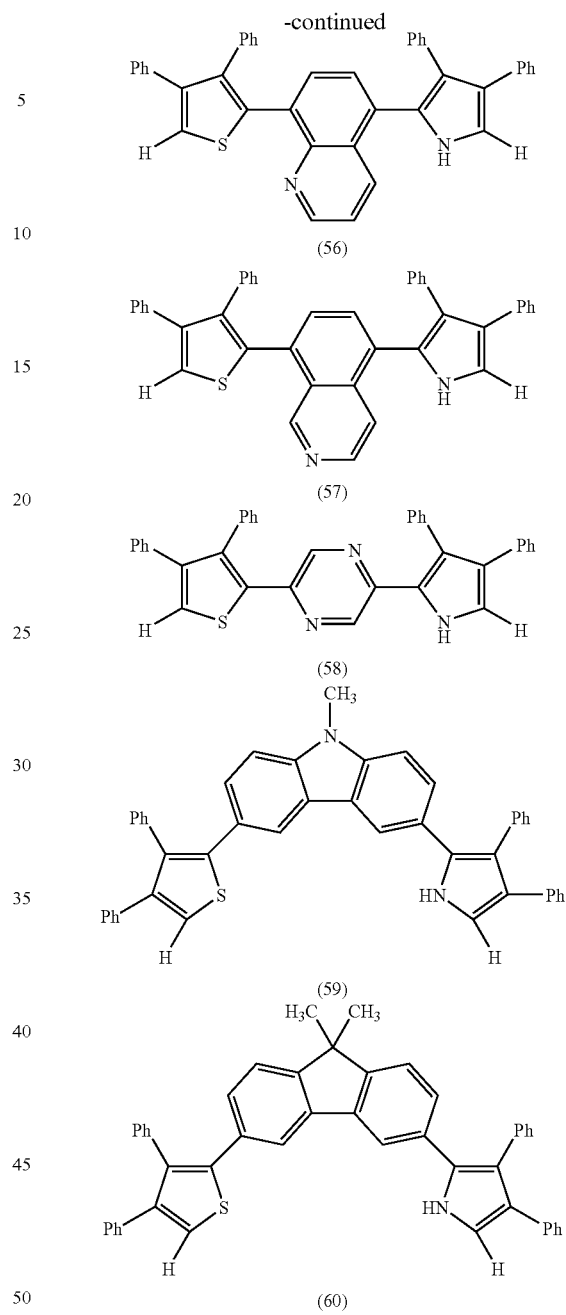

A polymer according to the present invention, which has a repeating unit represented by the aforementioned general formula (I), can be synthesized and formed as a patterned film by using electrolytic polymerization.

In the case of synthesis and deposition by electrolytic polymerization, a polymer that has a repeating unit represented by the aforementioned general formula (I) can be deposited on a patterned electrode by dipping a substrate that has the patterned electrode in a certain electrolytic solution and electrifying the electrolytic solution. In other words, a patterned layer including the polymer can be easily formed.

The patterned electrode in the specification denotes an electrode pattern for determining the shape that emits light when an electroluminescent device is made to emit light. For example, a plurality of stripe-shaped electrode patterns are used in the case of an electroluminescent device of a dot-matrix device, and a specific segment electrode pattern is used in the case of a segment device.

The certain electrolytic solution is a solution that has a supporting electrolyte dissolved in solvent, a solvent that has a high dielectric constant such as water, acetonitrile, or propylene carbonate is preferable as the solvent to be used, and various perchlorates, another salts, aids, or the like are used as the supporting electrolyte. A monomer represented by the aforementioned general formula (II), which is dissolved, is added to the electrolytic solution like this to carry out electrolytic polymerization.

Consequently, as a method of manufacturing an electroluminescent device using a layer including a polymer represented by the general formula (I), the aforementioned electrolytic polymerization can be used. For example, a layer including a polymer that has a repeating unit represented by the aforementioned general formula (I) is formed by electrolytic polymerization on a patterned electrode over a transparent substrate comprising glass, synthetic resin, or the like. The layer including the polymer that has the repeating unit represented by the aforementioned general formula (I) may be formed on the electrode and on the periphery thereof, and is not to be considered always limited to only the upper surface of the electrode.

In the case of using electrolytic polymerization to manufacture an electroluminescent device, what is necessary is to include a process of forming a layer including a polymer represented by the general formula (I) by electrolytic polymerization as described above, another operation, and treatment and the like may be included before and after the process of electrolytic polymerization or in the process as long as the electroluminescent device functions as it is.

In addition, as an electroluminescent device, a structure such as a device that has a layer including a conductive polymer, which is provided on an electrode, or a device that has a layer including a conductive polymer, which is provided on an electrode, and that has a layer comprising an inorganic compound between another electrode paring with the electrode and the layer including the conductive polymer, is exemplified. The order and number of layers to be laminated and the thickness of each layer are not particularly limited. Not only a light-emitting layer but also a hole transport layer and an electro transport layer may be formed. Alternatively, a charge injection layer may be provided in close contact with the electrode in order to improve adhesiveness to the electrode and improve a charge injection from the electrode. Alternatively, a thin buffer layer may be provided at an interface of a charge transport layer or a light-emitting layer in order to improve an adhesiveness of the interface, prevent crystallization, and the like.

Next, a method of manufacturing a light-emitting device that is capable of multicolor displaying will be described.

For example, a plurality of patterned electrodes are formed to correspond to a plurality of pixels over a transparent substrate comprising glass, synthetic resin, or the like. By dipping this substrate in an electrolytic solution including a monomer represented by the aforementioned general formula (I) and electrifying one of the electrodes, a layer including a first polymer that has a repeating unit represented by the aforementioned general formula (I) is formed on the electrified electrode as a light-emitting layer.

Again, the substrate is infiltrated with an electrolytic solution including a monomer that is different from the foregoing one, and in accordance with the same process, a layer including a second polymer represented by the aforementioned general formula (I), which is different from the first polymer, is formed as a light-emitting layer on an electrode that is different from the electrode on which the first polymer is deposited. By repeating the process like this, a plurality of pixels that emit light in different colors are formed over the transparent substrate.

EMBODIMENTS

Hereinafter, the drawings are used to describe embodiments of the present invention. The present invention is not to be considered limited to the descriptions of the following embodiments, unless depart from the scope thereof.

Embodiment 1

In the present embodiment, a method of manufacturing an electroluminescent device will be described.

FIG. 1 shows a sectional structure of an electroluminescent device.

On a glass substrate 100, an ITO film 101 of a thickness of 110 nm is deposited by sputtering, the ITO 101 is made into a dot shape of 2 mm×2 mm by etching, and the glass substrate 101 that the patterned ITO electrode 101 is dipped in an electrolytic solution that has a monomer represented by the following chemical formula (61) and uses ammonium perchlorate as a supporting electrolyte.

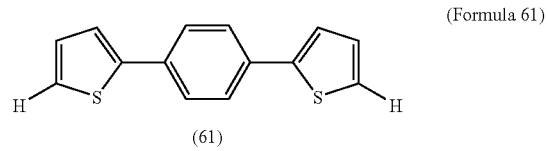

(Formula 61)

(61)

Then, by using the ITO electrode 101 as one electrode, preparing a platinum wiring as an electrode paring therewith, and applying a voltage therebetween, a light-emitting layer 102 including a polymer of the aforementioned chemical formula (61) is electrochemically formed on the ITO electrode 101.

After this is washed with water, vacuum drying is performed. Next, a cathode 103 is formed by depositing Ca and subsequently Al to manufacture the electroluminescent device.

In FIG. 1, what is necessary is that either the first electrode or the second electrode has transparency to visible light. Further, the second electrode is necessarily a cathode in the case where the first electrode is an anode while the second electrode is necessarily an anode in the case where the first electrode is a cathode.

Embodiment 2

In the present embodiment, a method of an active-matrix multicolor light-emitting device will be described.

Figure 2:
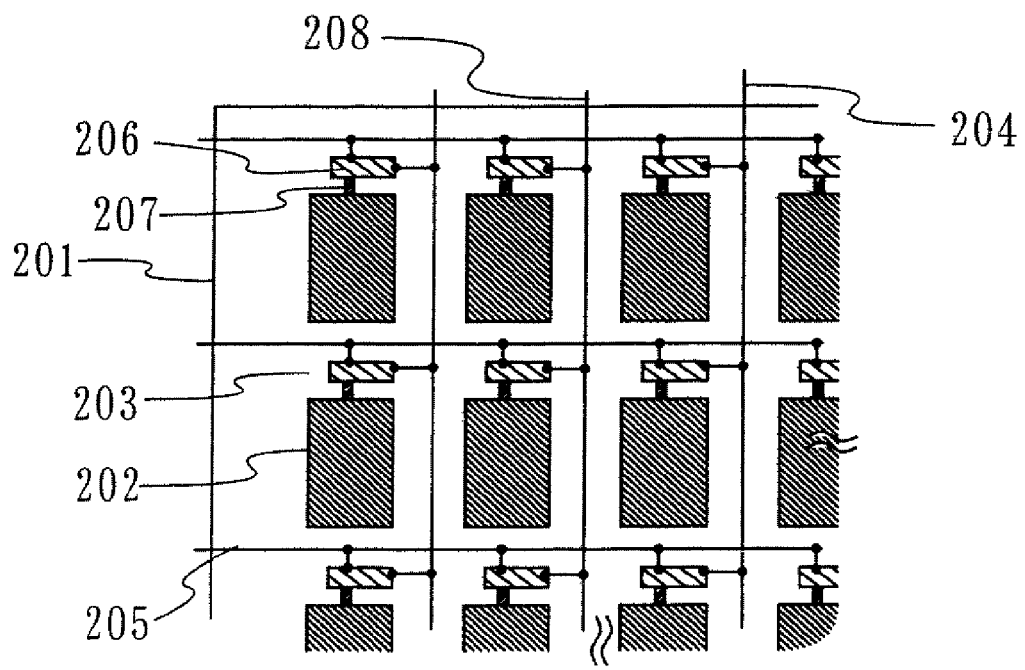
FIG. 2 is a top view of a light-emitting device.

FIG. 2 is a partial view of an active matrix light-emitting device.

On a transparent substrate 201 comprising glass, synthetic resin, or the like, a plurality of patterned first electrodes 202 are formed, and an insulator partition 203 projecting above more than the first electrodes 202 and surrounding a pixel portion is formed.

Further, a data signal line 204, a scan signal line 205, and a nonlinear element 206 are provided, and the nonlinear element is connected to the first electrode through a contact 207. With this, each pixel can be switched separately. The nonlinear element 206 is composed of, typically, an electrically connected thin film transistor and capacitor, a combination of a thin film transistor and a parasitic capacitor of the thin film transistor, or the like. In the same way as Embodiment 1, the substrate is dipped in an electrolytic solution that has a monomer represented by the aforementioned chemical formula (61) and uses ammonium perchlorate as a supporting electrolyte.

Then, by using the data signal line 204 as one electrode with a platinum wiring as a counter electrode and applying a voltage to these electrode, a film including a polymer of the aforementioned chemical formula (61) is electrochemically formed on the electrode on the nonlinear element connected to the data signal line 204.

Next, the glass substrate is dipped in an electrolytic solution that has a monomer represented by the following chemical formula (62) and uses ammonium perchlorate as a supporting electrolyte.

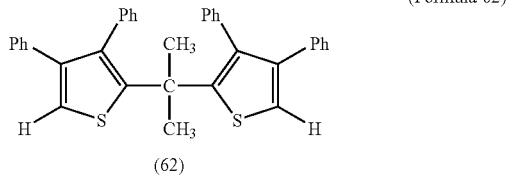

(Formula 62)

(62)

Then, by using a data signal line 208 and applying a voltage with a platinum wiring as a counter electrode, a film including a polymer of the aforementioned chemical formula (62) is electrochemically formed on the electrode on the nonlinear element connected to the data signal line 208. Thereon, a shared second electrode is formed all over the plurality of first electrodes.

In a light-emitting element of the light-emitting device of FIG. 2, what is necessary is that either the first electrode or the second electrode has transparency to visible light. Further, the second electrode is necessarily a cathode in the case where the first electrode is an anode while the second electrode is necessarily an anode in the case where the first electrode is a cathode.

Embodiment 3

In the present embodiment, a light-emitting device that has an electroluminescent device according to the present invention in a pixel portion will be described with reference to FIG. 3. FIG. 3(A) is a top view showing the light-emitting device and FIG. 3(B) is a sectional view of FIG. 3(A) cut along A-A'.

In FIG. 3(A), as for rectangular areas indicated by dotted lines, respectively, reference numeral 301 denotes a driver circuit portion (a source side driver circuit), 302 is a pixel portion, and 303 is a driver circuit portion (a gate side driver circuit). In addition, reference numeral 304 denotes a scaling substrate and 305 denotes a sealing agent. The inside 307 surrounded by the sealing agent 305 is space (void).

Reference numeral 308 denotes a wiring for transmitting signals to be input to the source side driver circuit 301 and the gate side driver circuit 303, and receives a video signal, a clock signal, a start signal, a reset signal, and the like from FPC (Flexible Printed Circuit) 309 that serves as an external input terminal. Though only the FPC is shown in the figure as the reference numeral 308 here, a printed wiring board (PWB) may be attached to the FPC. A light-emitting device in the specification includes not only a light-emitting device body but also a state where an FPC or a PWB is attached thereto.

Next, the sectional structure will be explained with reference to FIG. 3(B).

In the source side driver circuit 301, a CMOS circuit is formed of a combination of an n-channel TFT 323 and a p-channel TFT 324. The TFTs forming the driver circuit may also be formed of a known CMOS circuit, PMOS circuit, or NMOS circuit. The gate side driver circuit 303 is also similar to the source side driver circuit 301. Although the present embodiment shows a driver integrated type in which a driver circuit is formed over a substrate, which is not always necessary, the driver circuit can be formed not on the device substrate but at the outside thereof.

The pixel portion 302 is formed of a plurality of pixels, each including a switching TFT 311, a current controlling TFT 312, and a first electrode 313 connected to a drain thereof electrically.

In addition, an insulator 314 is formed to cover an edge of the first electrode 313. Here, the insulator 314 is formed of a positive photosensitive acrylic resin. Besides, in order to obtain a favorable coverage, the insulator 314 has a top portion or bottom potion formed with a curved surface with a curvature. For example, in the case of using positive photosensitive acrylic as a material of the insulator 314, only the top portion of the insulator 314 can easily have a curved surface with a curvature radius (0.2 μm to 3 μm). In addition, any of a photosensitive negative type that becomes insoluble in an etchant by light and a positive type that becomes soluble in an etchant by light can be used as the insulator 314.

On the first electrode 313, a light-emitting layer 416 and a second electrode 317 are respectively formed. Here, as a material that is used for the first electrode 313 functioning as an anode, it is preferable to use a material that has a large work function. For example, in addition to single layers such as an ITO (indium tin oxide) film, an indium zinc oxide (IZO) film, a titanium nitride film, a chromium film, a tungsten film, a Zn film, and a Pt film, a laminate of a titanium nitride film and a film including aluminum as its main component, a three-layer structure of a titanium nitride film, a film including aluminum as its main component, and a titanium nitride film, and the like can be used. When a laminated structure is employed, the resistance as a wiring is low, favorable ohmic contact can be taken, and it is possible to function as an anode.

Further, the light-emitting layer 316 is formed by electrolytic polymerization that is an electrochemical method. The light-emitting layer 316 includes a polymer that has a repeating unit of the aforementioned general formula (I) according to the present invention. In addition, the light-emitting layer 316 may include not only this polymer but also another material, which may be a low molecular weight compound, a high molecular compound, or a high molecular weight compound, or an inorganic compound. Further, the light-emitting layer 316 may have a single layer or a laminate of an organic compound of a high molecular weight compound or a low molecular weight compound, or a layer including an inorganic compound may be laminated in combination with these.

As a material that is used for the second electrode (cathode) 317 formed on the light-emitting layer 316, a material that has a small work function (Al, Ag, Li, or Ca, an alloy thereof such as MgAg, MgIn, AlLi, or CaF$_2$, or CaN) may be used. In the case of transmitting light generated in the light-emitting layer 316 through the second electrode 317, it is preferable to use a laminate of a thinned metal and a transparent conductive film (such as ITO (an alloy of indium oxide and tin oxide), an alloy of indium oxide and zinc oxide ($In_2O_3$—ZnO), or zinc oxide (ZnO)) film as the second electrode (cathode) 317.

Further, a structure is obtained by bonding the sealing substrate 304 and the device substrate 310 with the sealing agent 305, where an electroluminescent device 318 is equipped in the space 307 surrounded by the device substrate 301, the sealing substrate 304, and the sealing agent 305. The space 307 is filled with inert gas (such as nitrogen or argon), which may be filled with the sealing agent 305 alternatively.

It is preferable to use epoxy resin for the sealing agent 305, and a material that allows no permeation of moisture or oxygen to as much as possible is desirable. Further, as a material that is used for the sealing substrate 304, a plastic substrate comprising FRP (Fiberglass-Reinforced Plastics), PVF (polyvinylfluoride), Mylar, polyester, acrylic, or the like can be used besides a glass substrate and a quarts substrate.

In this way, the light-emitting device that has the electroluminescent device according to the present invention can be obtained.

Embodiment 4

In the present embodiment, various electric appliances completed with the use of a light-emitting device that has an electroluminescent device according to the present invention will be described.

As electric appliances manufactured with the use of a light-emitting device that has an electroluminescent device according to the present invention, a video camera, a digital camera, a goggle-type display (head mount display), a navigation system, a sound reproduction device (such as an in-car audio system or an audio set), a laptop personal computer, a game machine, a personal digital assistance (such as a mobile computer, a mobile phone, a portable game machine, or an electronic book), an image reproduction device equipped with a recording medium (specifically, a device equipped with a display device that can reproduce a recording medium such as a digital versatile disc (DVD) and display the image), and the like can be given. FIG. 4 shows specific examples of these electric appliances.

FIG. 4(A) is a display device, which includes a frame body 2001, a support 2002, a display portion 2003, a speaker portion 2004, a video input terminal 2005, and the like. A light-emitting device that has an electroluminescent device according to the present invention is used for the display portion 2003 to manufacture the display device. The display device includes all devices for displaying information such as for a personal computer, for receiving TV broad casting, and for displaying an advertisement.

FIG. 4(B) is a laptop personal computer, which includes a main body 2201, a frame body 2202, a display portion 2203, a keyboard 2204, an external connection port 2205, a pointing mouse 2206, and the like. A light-emitting device that has an organic light-emitting element according to the present invention is used for the display portion 2203 to manufacture the laptop personal computer.

FIG. 4(C) is a mobile computer, which includes a main body 2301, a display portion 2302, a switch 2303, an operation key 2304, an infrared port 2305, and the like. A light-emitting device that has an organic light-emitting element according to the present invention is used for the display portion 2302 to manufacture the mobile computer.

FIG. 4(D) is a portable image reproduction device equipped with a recording medium (specifically, a DVD reproduction device), which includes a main body 2401, a frame body 2402, a display portion A 2403, a display portion B 2404, a recording medium (such as DVD) reading portion 2405, an operation key 2406, a speaker portion 2407, and the like. The display portion A 2403 is used mainly for displaying image information while the display portion B 2404 is used mainly for displaying character information, and light-emitting device that has an organic light-emitting element according to the present invention is used for these display portion A 2403 and display portion B 2404 to manufacture the portable image reproduction device equipped with the recording medium. The image reproduction device equipped with the recording medium further includes a home game machine and the like.

FIG. 4(E) is a goggle-type display (head mount display), which includes a main body 2501, a display portion 2502, an arm portion 2503, and the like. A light-emitting device that has an organic light-emitting element according to the present invention is used for the display portion 2502 to manufacture the goggle-type display.

FIG. 4(F) is a video camera, which includes a main body 2601, a display portion 2602, a frame body 2603, an external connection port 2604, a remote control receiving portion 2605, an image receiving portion 2606, a battery 2607, a sound input portion 2608, an operation key 2609, an eye piece 2610, and the like. A light-emitting device that has an organic light-emitting element according to the present invention is used for the display portion 2602 to manufacture the video camera.

FIG. 4(G) is a mobile phone, which includes a main body 2701, a frame body 2702, a display portion 2703, a voice input portion 2704, a voice output portion 2705, an operation key 2706, an external connection port 2707, an antenna 2708, and the like. A light-emitting device that has an organic light-emitting element according to the present invention is used for the display portion 2703 to manufacture the mobile phone. The mobile phone can have power consumption suppressed by displaying white characters on a black background in the display portion 2703.

INDUSTRIAL APPLICABILITY

Since a novel polymer according to the present invention is easily formed by electrolytic polymerization as a patterned layer, a full-color electroluminescent device can be manufactured with higher productivity.

In addition, as described in Embodiment 4, a light-emitting device according to the present invention is quite widely applied, and this light-emitting device is applicable to electric appliances in all fields.

What is claimed is:

1. A polymer having the following general formula (I) as a repeating unit,

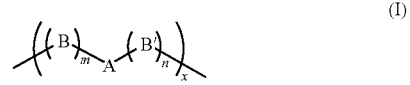

(I)

wherein, in the general formula (I), m and n are 2, x is a natural number larger than or equal to 2, A is any of the following (a-6) and (a-11), and B and B' are identical, and are (b-1), and

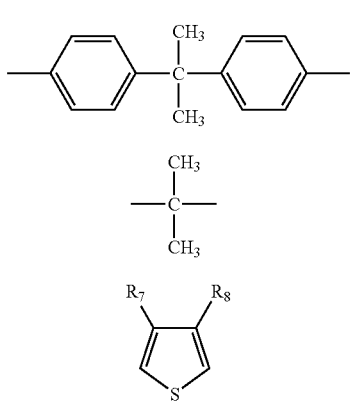

(a-6)

(a-11)

(b-1)

wherein R₇ and R₈ of (b-1) are identical or different, and R₇ and R₈ are a hydrogen atom, a halogen atom, or an organic substituent.

2. A light-emitting device having a layer including a polymer having a repeating unit represented by the following general formula (I) between a pair of electrodes,

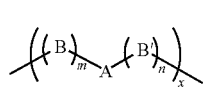

(I)

wherein, in the general formula (I), m and n are 1 or 2, x is a natural number larger than or equal to 2, A is any of the following (a-6) and (a-11), and B and B' are identical, and are (b-1), and

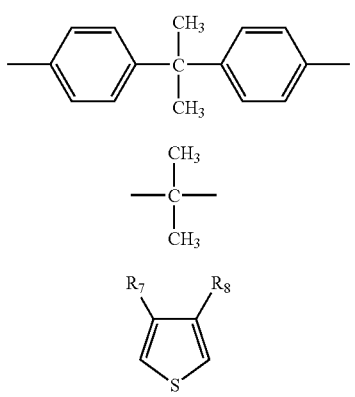

(a-6)

(a-11)

(b-1)

wherein R₇ and R₈ of (b-1) are identical or different, and R₇ and R₈ are a hydrogen atom, a halogen atom, or an organic substituent.

3. The light-emitting device according to claim 2, wherein the layer including the polymer is a layer formed by electrolytic polymerization.

4. A light-emitting device having a plurality of electroluminescent devices,
wherein each of the plurality of electroluminescent devices has an opposed pair of electrodes and a layer including a polymer, which is formed between a pair of electrodes,
wherein the polymer is a compound having a repeating unit represented by the following general formula (I),

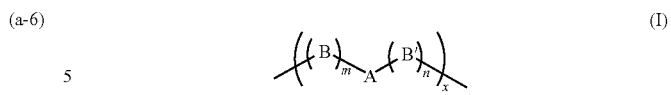

(I)

wherein, in the general formula (I), m and n are 1 or 2, x is a natural number larger than or equal to 2, A is any of the following (a-6) and (a-11), and B and B' are identical, and are (b-1), and

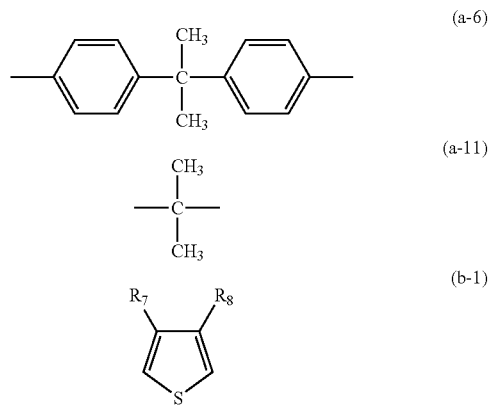

(a-6)

(a-11)

(b-1)

wherein R₇ and R₈ of (b-1) are identical or different, and R₇ and R₈ are a hydrogen atom, a halogen atom, or an organic substituent.

5. The light-emitting device according to claim 4, wherein the polymer in at least one of the plurality of electroluminescent devices is different from the polymer of the other electroluminescent devices.

6. A light-emitting device having:
a substrate having an insulating surface;
a plurality of stripe-shaped first electrodes formed at the insulating surface of the substrate;
a plurality of layers including a polymer, which are formed on the plurality of the stripe-shaped first electrodes; and
a plurality of stripe-shaped second electrodes arranged to be orthogonal to the stripe-shaped first electrodes, which are formed on the plurality of layers including the polymer,
wherein the polymer is a compound having a repeating unit represented by the following general formula (I),

(I)

wherein, in the general formula (I), m and n are 1 or 2, x is a natural number larger than or equal to 2, A is any of the following (a-6) and (a-11), and B and B' are identical, and are (b-1), and

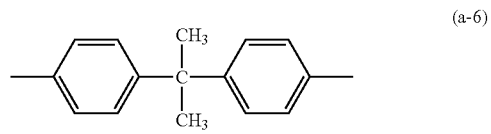

(a-6)

-continued

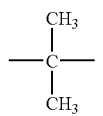
(a-11)

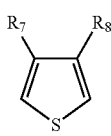
(b-1)

wherein R$_7$ and R$_8$ of (b-1) are identical or different, and R$_7$ and R$_8$ are a hydrogen atom, a halogen atom, or an organic substituent.

7. The light-emitting device according to claim 6, wherein the polymer in at least one of the plurality of layers is different from the polymer of the other layers.

8. The light-emitting device according to claim 6, wherein the layers including the polymer are layers formed by electrolytic polymerization.

9. A light-emitting device having:
a substrate having an insulating surface;
a plurality of first electrodes formed at the insulating surface of the substrate;
a plurality of layers including a polymer, which are formed on each of the plurality of first electrodes; and
a second electrode opposed to each of the plurality of first electrodes with the plurality of layers including the polymer interposed in between,
wherein the polymer is a compound having a repeating unit represented by the following general formula (I),

(I)

wherein, in the general formula (I), m and n are 1 or 2, x is a natural number larger than or equal to 2, A is any of the following (a-6) and (a-11), and B and B' are identical, and are (b-1),

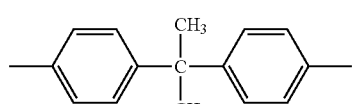
(a-6)

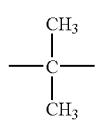
(a-11)

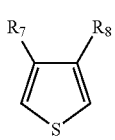
(b-1)

wherein R$_7$ and R$_8$ of (b-1) are identical or different, and R$_7$ and R$_8$ are a hydrogen atom, a halogen atom, or an organic substituent.

10. The light-emitting device according to claim 9, wherein the polymer in at least one of the plurality of layers is different from the polymer of the other layers.

11. A light-emitting device having a plurality of first to third pixels that emit light in different colors from each other on a substrate having an insulating surface, having:
a plurality of first electrodes;
a layer including a polymer, which is formed on each of the plurality of first electrodes; and
a second electrode opposed to the plurality of first electrodes, which is formed on the layer including the polymer,
wherein the second electrode is provided in common with the plurality of first to third pixels, and
wherein the polymer is a compound that has a repeating unit represented by the following general formula (I), and the polymer of the layer including the polymer is different from each other in the first to third pixels,

(I)

wherein, in the general formula (I), m and n are 1 or 2, x is a natural number larger than or equal to 2, A is any of the following (a-6) and (a-11), and B and B' are identical, and are (b-1),

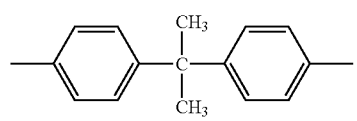
(a-6)

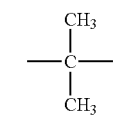
(a-11)

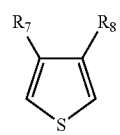
(b-1)

wherein R$_7$ and R$_8$ of (b-1) are identical or different, and R$_7$ and R$_8$ are a hydrogen atom, a halogen atom, or an organic substituent.

12. The light-emitting device according to claim 9, wherein the plurality of layers including the polymer are layers formed by electrolytic polymerization.

13. The light-emitting device according to claim 9, further comprising a plurality of data signal lines, a plurality of scan signal lines, and a plurality of nonlinear elements,
wherein one of the plurality of nonlinear elements is connected to a corresponding one of the plurality of data signal lines and a corresponding one of the plurality of scan signal lines, and
wherein one of the plurality of first electrodes is electrically connected to a corresponding one of the plurality of nonlinear elements.

14. The light-emitting device according to claim 13, wherein a thin film transistor is used as at least one of the nonlinear elements.

* * * * *